United States Patent
Anderson et al.

(10) Patent No.: US 10,545,291 B1
(45) Date of Patent: Jan. 28, 2020

(54) GAIN INTEGRATION IN SI PHOTONIC COHERENT MODULATORS

(71) Applicant: Cisco Technology, Inc., San Jose, CA (US)

(72) Inventors: Sean P. Anderson, Macungie, PA (US); Dominic F. Siriani, Allentown, PA (US); Jock T. Bovington, La Mesa, CA (US); Matthew J. Traverso, Santa Clara, CA (US); Vipulkumar Patel, Breinigsville, PA (US)

(73) Assignee: Cisco Technology, Inc., San Jose, CA (US)

( * ) Notice: Subject to any disclaimer, the term of this patent is extended or adjusted under 35 U.S.C. 154(b) by 0 days.

(21) Appl. No.: 16/115,432

(22) Filed: Aug. 28, 2018

(51) Int. Cl.
*G02B 6/30* (2006.01)
*G02B 6/122* (2006.01)
*G02B 6/14* (2006.01)
*G02B 6/28* (2006.01)
*G02B 6/12* (2006.01)

(52) U.S. Cl.
CPC ........... *G02B 6/305* (2013.01); *G02B 6/1228* (2013.01); *G02B 6/14* (2013.01); *G02B 6/2835* (2013.01); *G02B 2006/12061* (2013.01); *G02B 2006/12147* (2013.01)

(58) Field of Classification Search
None
See application file for complete search history.

(56) References Cited

U.S. PATENT DOCUMENTS

| 7,046,880 | B2 * | 5/2006 | Bouda | G02B 6/1228 |
| | | | | 385/129 |
| 7,373,048 | B2 * | 5/2008 | Xia | B82Y 20/00 |
| | | | | 359/341.1 |
| 8,285,092 | B2 * | 10/2012 | Deki | G02B 6/305 |
| | | | | 385/28 |
| 8,358,885 | B2 * | 1/2013 | Jeong | G02B 6/1228 |
| | | | | 385/32 |
| 9,097,846 | B2 * | 8/2015 | Mizrahi | G02B 6/122 |
| 9,274,275 | B2 | 3/2016 | Webster et al. | |
| 9,310,555 | B2 * | 4/2016 | Sun | G02B 6/14 |

(Continued)

OTHER PUBLICATIONS

Juodawlkis et al. "High-Power, Low-Noise 1.5 Micron Slab-Coupled Optical Waveguide (SCOW) Emitters: Physics, Devices, and Applications," IEEE Journal of Selected Topics in Quantum Electronics, vol. 17, No. 6, Nov.-Dec. 2011, p. 1698-1714. (Year: 2011).*

(Continued)

*Primary Examiner* — Rhonda S Peace
(74) *Attorney, Agent, or Firm* — Patterson + Sheridan, LLP

(57) ABSTRACT

The embodiments herein describe an optical transmitter that integrates a SCOWA into a photonic chip that includes a modulator. The embodiments herein place the SCOWA between the laser and the modulator. To accommodate the large mode size of the waveguide in the SCOWA, the photonic chip includes a pair of spot size converters coupled to the input and output of the SCOWA. Rather than amplifying a modulated signal as is typical with an inline amplifier, the SCOWA amplifies a continuous wave (CW) optical signal generated by the laser which introduces less noise and improves the OSNR of the transmitter.

20 Claims, 11 Drawing Sheets

(56) References Cited

U.S. PATENT DOCUMENTS

2004/0114869 A1\*  6/2004  Fike ..................... G02B 6/124
                                                        385/43
2005/0008316 A1\*  1/2005  Yeniay ................ G02B 6/1228
                                                       385/129

OTHER PUBLICATIONS

G. M. Smith et al., "Coherent beam combining with high-power slab-coupled optical waveguide amplifiers," 2012 IEEE Photonics Society Summer Topical Meeting Series, Seattle, WA, 2012, pp. 23-24. (Year: 2012).\*

Thorlabs.com-C-Band Optical Amplifiers (BOAs and SOAs), 1550 nm, 7 pages [Accessed Online Sep. 1, 2018] <https://www.thorlabs.com/newgrouppage9.cfm?objectgroup_id=3901>.

Juodawlkis et al, "High-Power, Low-Noise 1.5-?m Slab-Coupled Optical Waveguide (SCOW) Emitters: Physics, Devices, and Applications," IEEE Journal of Selected Topics in Quantum Electronics, vol. 17, No. 6, Nov./Dec. 2011, 17 pages.

\* cited by examiner

GAIN INTEGRATION IN SI PHOTONIC COHERENT MODULATORS

TECHNICAL FIELD

Embodiments presented in this disclosure generally relate to integrating a slab-coupled optical waveguide amplifier (SCOWA) with a semiconductor photonic chip.

BACKGROUND

Coherent modulation formats are of primary interest for long-haul and metro applications, and are gaining increased attention for shorter-reach and data center interconnect (DCI) applications. However, coherent modulators in silicon are inherently high-loss due to modulating both phase and amplitude. For upcoming 600GB, 800GB, and 1TB applications, the transmitter insertion loss of the coherent modulators is estimated at 25-29 dB. Meanwhile, the required transmitter output power into the optical fiber is between 0 and +3 dBm. To meet this requirement, an Integrated Tunable Laser Assembly (ITLA) would need to achieve +25 to 30 dBm output, or up to 1 Watt. Such a laser is prohibitive from both a cost and power consumption point of view. Currently, tunable lasers are only available with +18 dBm output power.

An inline amplifier (e.g., micro Erbium-doped fiber amplifier (EDFA)) can be used to relax the required input power from the laser. However, adding the inline amplifier introduces excess noise into the modulated signal, which can significantly reduce transmission distance. As modulation format complexity increases, higher output optical signal to noise ratio (OSNR) is desired. For 1TB optical links, greater than 45 dB OSNR is desired. Thus, no more than 3-4 dB of gain is achievable due to noise introduced by the inline amplifier.

BRIEF DESCRIPTION OF THE DRAWINGS

So that the manner in which the above-recited features of the present disclosure can be understood in detail, a more particular description of the disclosure, briefly summarized above, may be had by reference to embodiments, some of which are illustrated in the appended drawings. It is to be noted, however, that the appended drawings illustrate only typical embodiments of this disclosure and are therefore not to be considered limiting of its scope, for the disclosure may admit to other equally effective embodiments.

To facilitate understanding, identical reference numerals have been used, where possible, to designate identical elements that are common to the figures. It is contemplated that elements disclosed in one embodiment may be beneficially utilized on other embodiments without specific recitation.

DESCRIPTION OF EXAMPLE EMBODIMENTS

Overview

Figure 1:
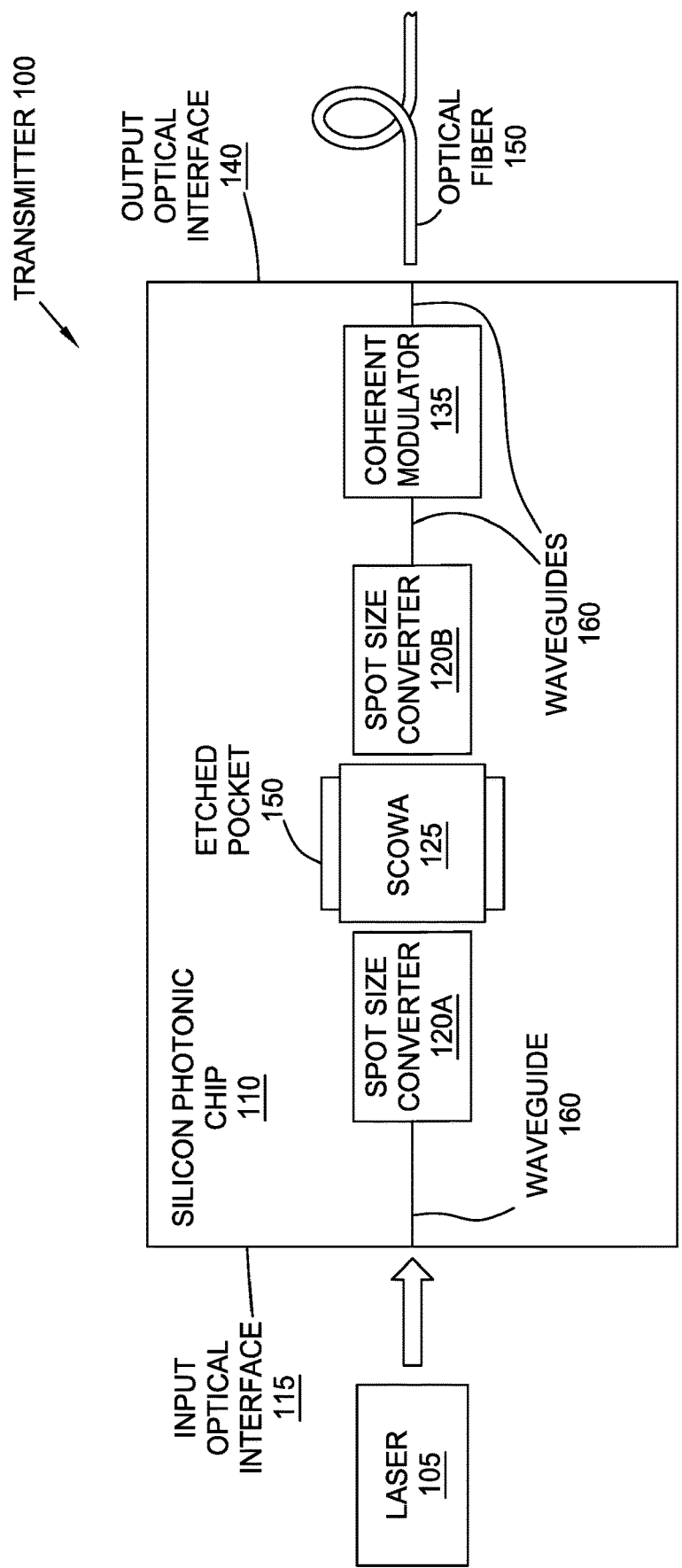
FIG. 1 illustrates a transmitter with a SCOWA mounted on a silicon photonic chip, according to one embodiment described herein.

One embodiment presented in this disclosure is a semiconductor photonic chip that includes an input optical interface configured to receive an optical signal from an optical source and a first spot size converter comprising an input optically coupled to the input optical interface and an output optically coupled to a slab-coupled optical waveguide amplifier (SCOWA). The first spot size converter is configured to increase a mode size of the optical signal before transferring the optical signal to the SCOWA. The photonic chip also includes a second spot size converter comprising an input optically coupled to the SCOWA and an output optically coupled to an optical component where the second spot size converter is configured to decrease the mode size of an amplified optical signal received from the SCOWA before transferring the amplified optical signal to the optical component.

Another embodiment presented in this disclosure is an optical transmitter that includes a laser configured to output a continuous wave (CW) optical signal and a photonic chip optically coupled to the laser. The photonic chip includes a first spot size converter comprising an input optically coupled to the laser and an output optically coupled to a SCOWA where the first spot size converter is configured to adjust a mode size of the CW optical signal before transferring the unmodulated optical signal to the SCOWA, a modulator, and a second spot size converter comprising an input optically coupled to the SCOWA and an output optically coupled to the modulator where the second spot size converter is configured to adjust the mode size of an amplified optical signal received from the SCOWA before transferring the amplified optical signal to the modulator.

Another embodiment presented in this disclosure is a semiconductor photonic chip that includes a first spot size converter comprising an input configured to receive an optical signal and an output optically coupled to a slab-coupled optical waveguide amplifier (SCOWA) and a second spot size converter comprising an input optically coupled to the SCOWA and an output optically coupled to an optical component. The SCOWA is disposed in an etched pocket disposed between the first and second spot size converters and the first and second spot size converters are configured to adjust a mode size of optical signals to better match respective mode sizes of waveguides corresponding to the SCOWA and the optical component.

Example Embodiments

The embodiments herein describe an optical transmitter that integrates a SCOWA into a silicon photonic chip that includes a coherent modulator. As mentioned above, the laser (e.g., an ITLA) for the transmitter may be unable to produce sufficient output power for coherent modulation. Rather than using an inline amplifier which introduces noise and reduces the OSNR, the embodiments herein place the SCOWA between the laser and the coherent modulator. Thus, rather than amplifying a modulated signal as is typical with an inline amplifier, the SCOWA amplifies a continuous wave (CW) optical signal generated by the laser which introduces less noise and improves the OSNR of the transmitter.

In one embodiment, the photonic chip includes an etched pocket in which the SCOWA is disposed. The chip includes waveguides that are optically coupled to the SCOWA using a pair of spot size converters, where one converter is coupled to an input of the SCOWA to transmit the CW signal into the SCOWA and another converter at the output of the SCOWA to receive the amplified optical signal which is then transmitted to the coherent modulator on the chip. The SCOWA has a single mode waveguide which is much larger in diameter (e.g., by a factor of two) than other types of semiconductor optical amplifiers (SOAs) which results in the SCOWA having more relaxed alignment tolerances and higher power outputs than other types of SOAs.

FIG. 1 illustrates a transmitter 100 with a SCOWA 125 mounted on a silicon photonic chip, according to one embodiment described herein. The transmitter 100 includes a laser 105 aligned to an input optical interface 115 of a silicon photonic chip 110. In one embodiment, the laser 105 is an ITLA that outputs a CW optical signal, but can be other types of optical sources. That is, the laser 105 outputs an unmodulated optical signal. However, the output power of the laser 105 may be insufficient for coherent modulation.

A waveguide 160 (e.g., a sub-micron waveguide) in the photonic chip 110 routes the CW optical signal to a spot size converter 120A. Because the mode of the CW optical signal in the waveguide 160 may be much smaller than the mode size of the waveguide in the SCOWA 125, as the optical signal propagates through the spot size converter 120A, the converter 120A increases the size of the optical mode to better match the mode of the waveguide formed by the SCOWA 125. As such, the optical coupling efficiency between the photonic chip 110 and the SCOWA 125 is improved.

In FIG. 1, the photonic chip 110 includes an etched pocket 130 in which at least a portion of the SCOWA is disposed. That is FIG. 1 provides a top view of the photonic chip 110 where the pocket 130 is etched in a direction into the page. This pocket 130 (or recess) provides a space where the waveguide portion of the SCOWA 125 can be disposed to align with the first spot size converter 120A at an input interface and with a second spot size converter 120B at an output interface of the SCOWA 125. The second spot size converter 120B receives the optical signal from the SCOWA 125 and reduces the mode size so the optical signal better matches the mode size of the waveguide 160. Although the spot size converters 120 are shown as physically coupling to the waveguides 160, the converters 120 may be evanescently coupled to the waveguides 160.

The amplified CW optical signal generated by the SCOWA 125 is provided to a coherent modulator 135 which performs coherent modulation. The coherent modulator 135 modulates the data and can output a signal for 600G, 800G, or 1TB applications. Although the embodiments herein describe using a SCOWA 125 to amplify an optical signal for coherent modulation, the embodiments are not limited to such. For example, the SCOWA 125 can be used to amplify CW signals before those signals are transmitted to other types of modulation formats that transmit data at lower speeds. Doing so may permit the use of less powerful lasers 105 which can reduce costs.

Although the embodiments herein describe using the SCOWA 125 in a transmitter, the spot size converters 120 and the SCOWA 125 may be used in other silicon photonic applications such as a laser, a pre-amplifier, a booster amplifier, or an amplifier inside of a lossy photonic integrated circuit (PIC) such as a high port count switch. In these examples, the output of the SCOWA 125 may be coupled to a different optical component than the modulator 135.

The modulated optical signals generated by the coherent modulator 135 are outputted at an output optical interface 140 and into an optical fiber 150. Although not shown, the photonic chip 110 may also include spot size converters at the input and output optical interfaces 115 and 140 since the mode size of the optical signal generated by the laser 105 and the mode size of the waveguide in the optical fiber 150 may be significantly different from the mode size of the waveguides 160 in the photonic chip 110. In another embodiment, the transmitter 100 may include lenses at the input and output optical interfaces 115 and 140 to compensate for the different mode sizes.

Figure 2:
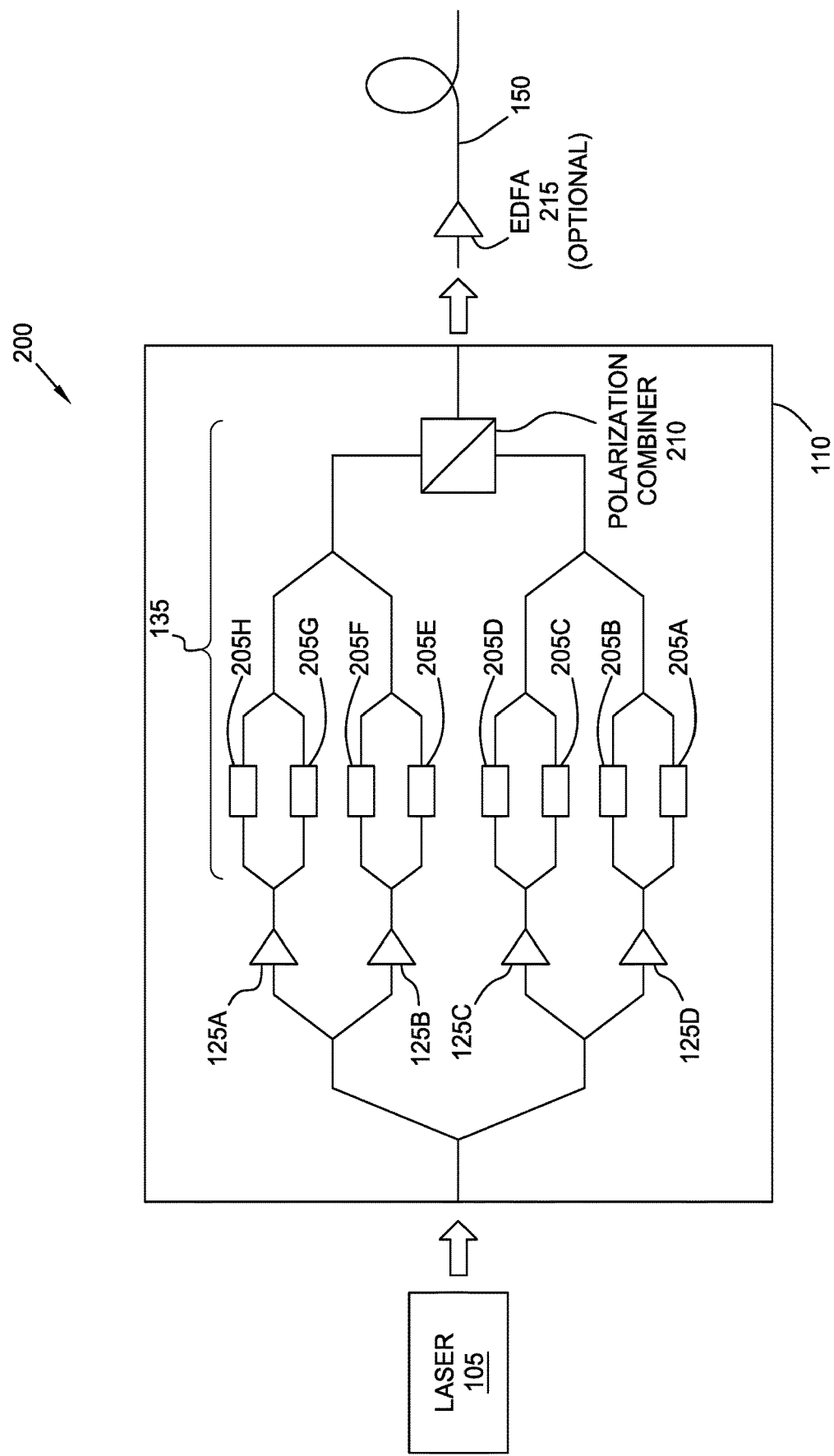
FIG. 2 illustrates a transmitter with multiple SCOWAs mounted on a silicon photonic chip, according to one embodiment described herein.

FIG. 2 illustrates a transmitter 200 with multiple SCOWAs 125 mounted on the silicon photonic chip 110, according to one embodiment described herein. In this embodiment, the photonic chip 110 includes four SCOWAs 125 disposed between the components in the coherent modulator 135 and the laser 105. As shown, the waveguides 160 in the chip 110 include three splits (e.g., three splitters) which divide the optical signal into four CW optical signals that are in turn inputted into the SCOWAs 125.

The amplified optical signals generated by the SCOWAs 125 are then split again and pass through phase modulators 205. The phase modulators 205 are controlled by electrical control signals (not shown) which selectively change the phase of the respective optical signals. The optical signals are then recombined using multiple joins in the waveguides (e.g., combiners) coupled to the outputs of the phase modulators 205. In one embodiment, the phase modulators 205 are arranged to form one or more IQ modulators.

The combined signal of the phase modulators 205 in the upper half of the coherent modulator 135 (e.g., the phase modulators 205E-205H) provides a first input into a polarization combiner 210, while the combined signal of the phase modulators 205 in the lower half of the coherent modulator 135 (e.g., the phase modulators 205A-205D) provides a second input of the polarization combiner 210. In one embodiment, the polarization combiner 210 rotates the polarization of one of the optical signals at its inputs into a different polarization and then outputs the combined signal. For example, assuming the optical signals inputted into the polarization combiner 210 are both transverse-electric (TE) polarized, the combiner 210 rotates one of the signals to be transverse-magnetic (TM) polarized and then combines the two signals to output a combined TE and TM signal. By including both TE and TM polarized signals, this permits the transmitter 200 to use the same range of wavelengths to include more data than an optical signal that uses only one polarization (i.e., either TE or TM but not both).

In FIG. 2, the photonic chip 110 transmits the combined TE and TM optical signal to an EDFA 215 for further amplification. However, because of the inclusion of the SCOWAs 125, the EDFA 215 is optional. Nonetheless, the transmitter 200 may include the EDFA 215 to further amplify the modulated optical signal so long as the OSNR is acceptable. The output of the EDFA 215 is coupled to the fiber optic cable 150 which transmits the modulated optical signal to a downstream optical receiver (not shown). In one embodiment, the transmitter 200 is capable of 800G data rates but is not limited to such.

Figure 3:
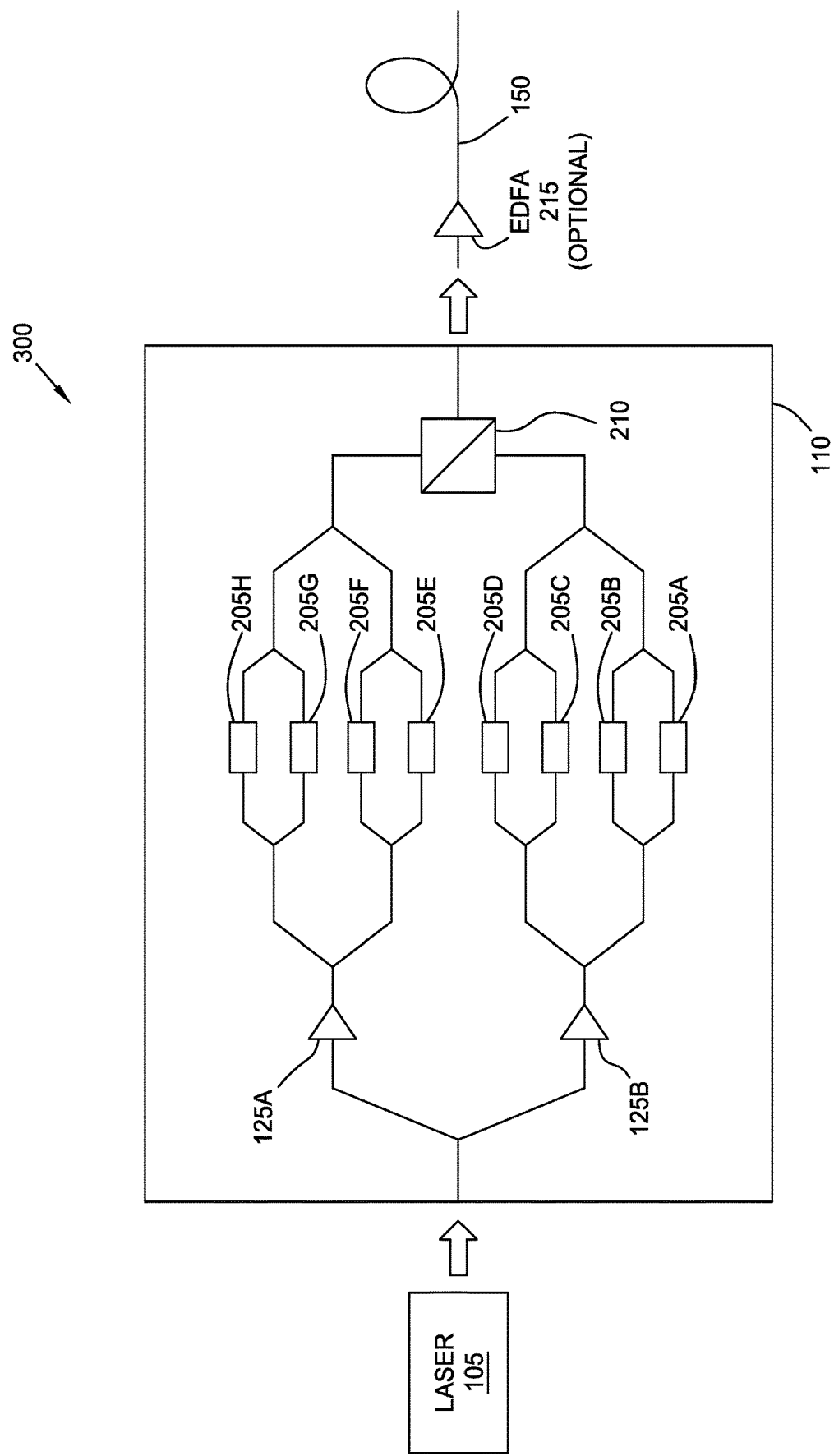
FIG. 3 illustrates a transmitter with multiple SCOWAs mounted on a silicon photonic chip, according to one embodiment described herein.

FIG. 3 illustrates a transmitter 300 with multiple SCOWAs 125 mounted on a silicon photonic chip 110, according to one embodiment described herein. In this example, rather than four SCOWAs 125 like FIG. 2, the chip 110 includes two SCOWAs for amplifying the CW optical signal outputted by the laser 105. The waveguides in the photonic chip 110 include a splitter which splits the optical signal received from the laser 105 and inputs respective signals into the SCOWAs 125. The SCOWA 125A generates an amplified CW optical signal which is split several more times before being modulated by the upper half of the coherent modulator 135 (e.g., the phase modulates 205E-205H). The SCOWA 125B generates an amplified CW optical signal which is split several more times before being modulated by the lower half of the coherent modulator 135 (e.g., the phase modulates 205A-205D). The combined outputs of the upper and lower halves of the coherent modulator are inputted into the polarization combiner 210 where the polarization of one of the inputs is rotated before the two optical signals are combined as described above.

The photonic chip 110 transmits the optical signal generated by the modulator 135 to the EDFA 215 for further amplification. However, because of the inclusion of the SCOWAs 125, the EDFA 215 is optional. The output of the EDFA 215 is coupled to the fiber optic cable 150 which transmits the modulated optical signal to a downstream optical receiver (not shown). In one embodiment, the transmitter 300 is capable of 800G data rates but is not limited to such.

Figure 4:
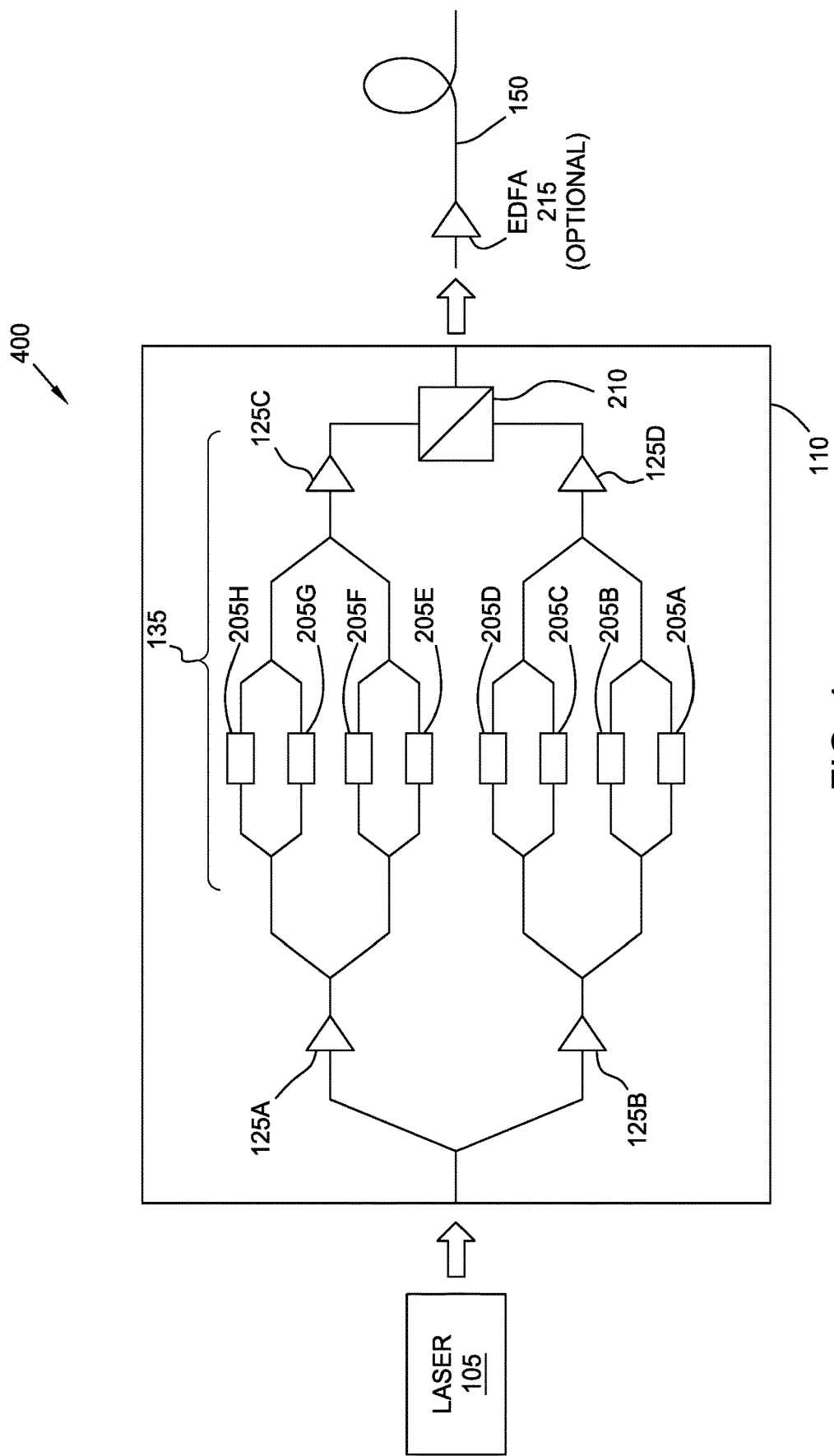
FIG. 4 illustrates a transmitter with multiple SCOWAs mounted on a silicon photonic chip, according to one embodiment described herein.

FIG. 4 illustrates a transmitter 400 with multiple SCOWAs 125 mounted on a silicon photonic chip 110, according to one embodiment described herein. The transmitter 400 is the same as the transmitter 300 except for the inclusion of two additional SCOWAs 125C and 125D between the outputs of the phase modulators 205 and the input of the polarization combiner 210. Thus, in addition to amplifying the optical signal generated by the laser 105 before that signal is modulated (which is performed by the SCOWAs 125A and 125B), the transmitter 400 uses the SCOWAs 125C and 125D to amplify the optical signals after they have been modulated and combined. Doing so may further reduce the usefulness of having a separate EDFA 215 at the output of the photonic chip 110.

Figure 5:
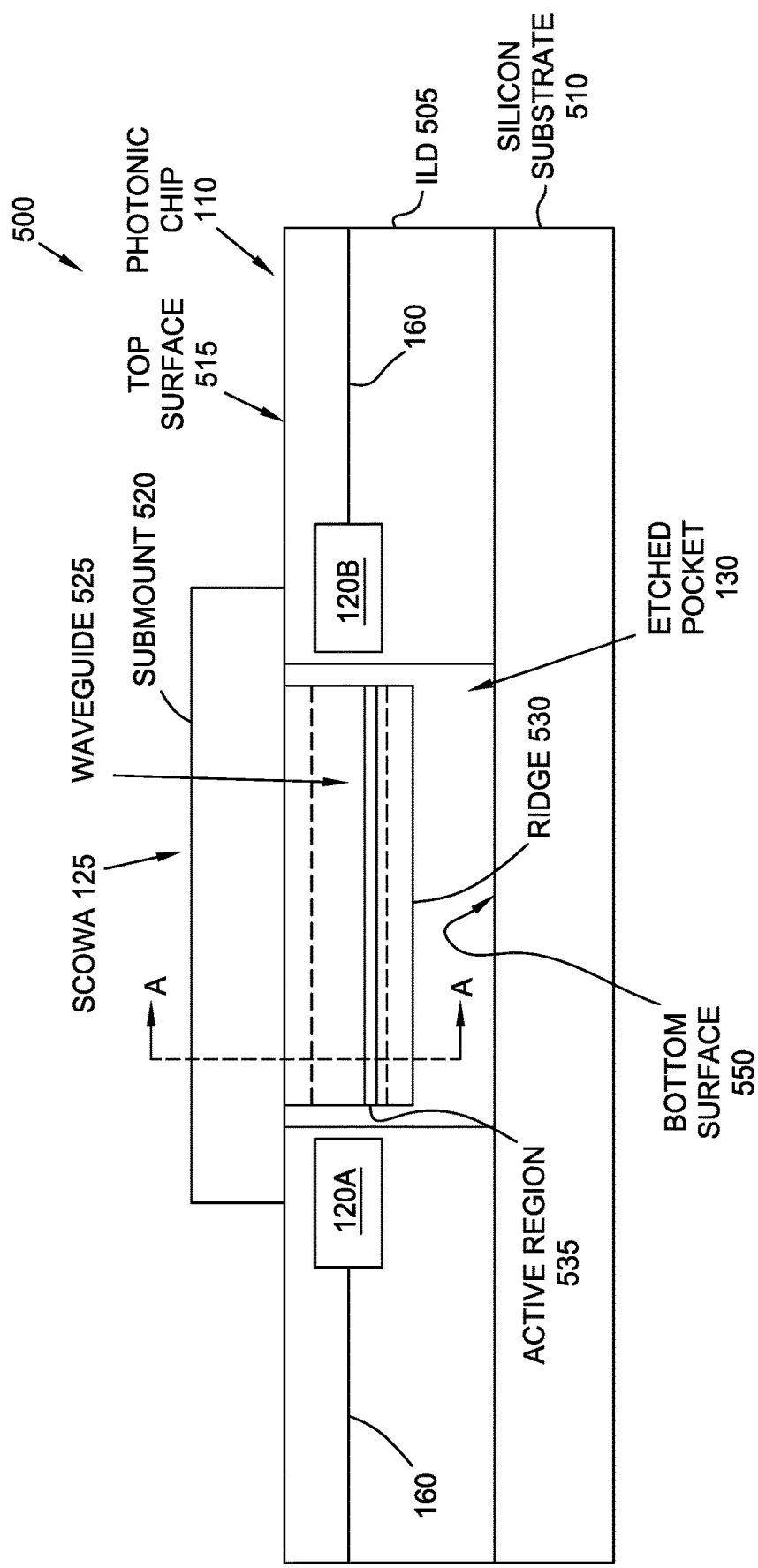
FIG. 5 illustrates a side view of a SCOWA mounted on a silicon photonic chip, according to one embodiment described herein.

FIG. 5 illustrates a side view 500 of the SCOWA 125 mounted on a silicon photonic chip 110, according to one embodiment described herein. The chip 110 includes an interlayer dielectric (ILD) 505 disposed on a silicon substrate 510 (e.g., a crystalline silicon substrate). During fabrication, the ILD 505 (e.g., an insulative material) is processed to form the spot size converters 120 which transfer an optical signal into, and receive an amplifier optical signal from, the SCOWA 125 as well as the waveguides 160 (e.g., silicon nitride or silicon oxy-nitride waveguides).

As shown, a first portion of the SCOWA 125 is arranged within the etched pocket 130 formed in the ILD 505 of the photonic chip such that respective ends of a waveguide 525 in the SCOWA 125 (shown generally by the dotted lines) is aligned with the spot size converters 120. The SCOWA 125 includes a ridge 530 and an active region 535 (e.g., quantum wells) which confine the optical signal within the waveguide 525 and provide optical amplification. The functions of these components are discussed in more detail below.

A second portion of the SCOWA 125 is disposed above the ILD 505. Specifically, the SCOWA 125 includes a submount 520 which supports the waveguide 525 and the ridge 530 disposed in the etched pocket 130. When aligning the SCOWA 125 to the spot size converters 120, the submount 520 is brought into contact with a top surface 515 of the photonic chip 110. Although not shown, an adhesive may be used to fasten the submount 520 to the top surface 515 thereby maintaining the alignment between the waveguide 525 and the spot size converters 120.

In one embodiment, the SCOWA 125 includes at least two electrodes for providing power to perform optical amplification on the optical signal propagating in the waveguide 525. In one example, electrodes are disposed on a top surface of the submount 520 and can be wire bonded to a power source on the photonic chip 110 or another chip. In another example, at least one electrode may be disposed on the top surface of the submount 520 while another electrode is disposed on the bottom surface of the ridge 530 (e.g., the side of the ridge 530 in a facing relationship with a bottom surface 550 of the etched pocket 130). The chip 110 may include an electrode on the bottom surface 550 of the etched pocket 130 which is then soldered to the electrode disposed on the bottom surface of the ridge 530 for providing power to the SCOWA 125.

Figure 6:
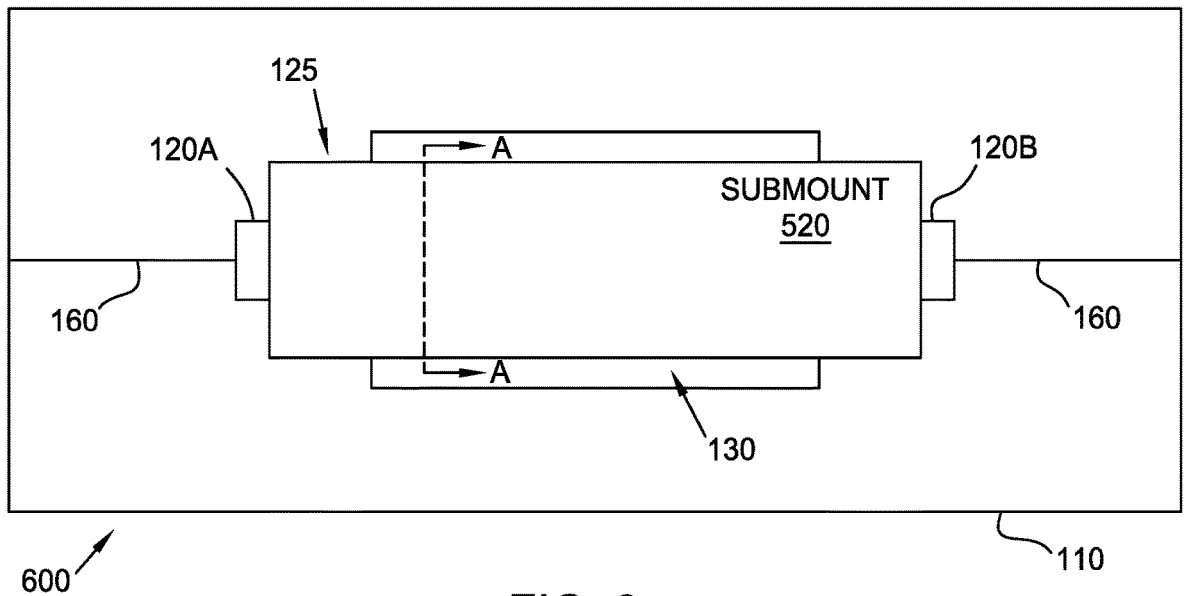
FIG. 6 illustrates a top view of a SCOWA mounted on a silicon photonic chip, according to one embodiment described herein.

FIG. 6 illustrates a top view 600 of a SCOWA 125 mounted on a silicon photonic chip 110, according to one embodiment described herein. That is, FIG. 6 illustrates the top view 600 of the same structure shown by the side view 500 in FIG. 5. As illustrated, portions of the spot size converters 120 closest to the etched pocket 130 are occluded by the submount 520. However, the overlap of the submount 520 and the top surface of the photonic chip 110 can vary.

Figure 7:
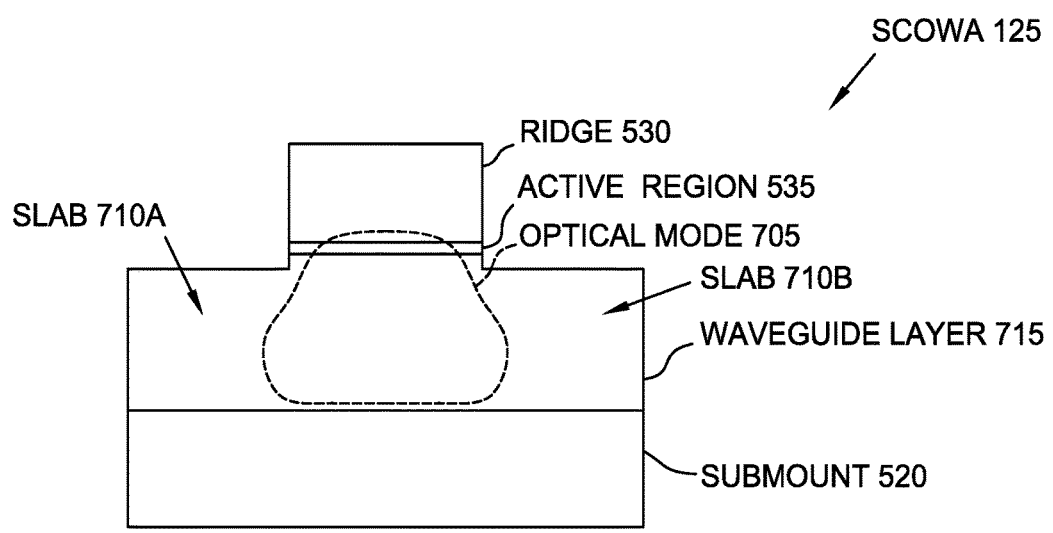
FIG. 7 illustrates a cross sectional view of a SCOWA, according to one embodiment described herein.

FIG. 7 illustrates a cross sectional view of the SCOWA 125 illustrated in FIGS. 5 and 6 along the dotted lines labeled A-A, according to one embodiment described herein. The ridge 530 forms part of a ridge waveguide which generally confines the optical signal within a portion of a waveguide layer 715 (represented here by the optical mode 705). Put differently, the majority of the power of the optical signal is confined with the region defined by the optical mode 705.

Moreover, unlike other SOAs where the active region is at or near the middle of the optical mode 705, in the SCOWA 125 the active region 535 is located near the border of the optical mode 705 (e.g., the top portion of the optical mode 705). Thus, most of the optical signal propagates in the waveguide layer 715 and not in the active region 535 and even less in the ridge 530.

In one embodiment, the thickness of the waveguide layer 715 is 3-5 microns and is formed from an III-V semiconductor alloy. As such, the diameter of the mode 705 may be 4-5 microns which is much larger than most SOAs that support single mode amplification. As the mode size increases, the optical signal typically has multiple modes. However, the SCOWA 125 can have a large mode size and still support single mode amplification because of slab regions 710 in the waveguide layer 715. As an optical signal propagating in the SCOWA 125 generates additional modes, these modes are transmitted into, and filtered out, by the slab regions 710A and 710B. In this manner, the SCOWA 125 supports single mode operation at larger mode sizes than other SOAs. In one embodiment, the SCOWA 125 is a multi-mode amplifier with a mode size of the fundamental mode greater than 2.5 um 1/e^2 diameter which can have significantly higher mode gain than any other higher order modes. The relationship 1/e^2 is a typical metric for describing the size of a Gaussian beam.

As mentioned above, the large optical mode 705 relaxes the alignment tolerances for aligning the SCOWA 125 to the spot size converters in the photonic chip. Further, the amplification generated by the SCOWA 125 can compensate for the higher losses suffered when data rates are increased. For example, the SCOWA 125 can be used in a transmitter that has an optical signal greater than 50 GHz and a data rate that can be between 100 Gps and 1 Tbps.

Figure 8:
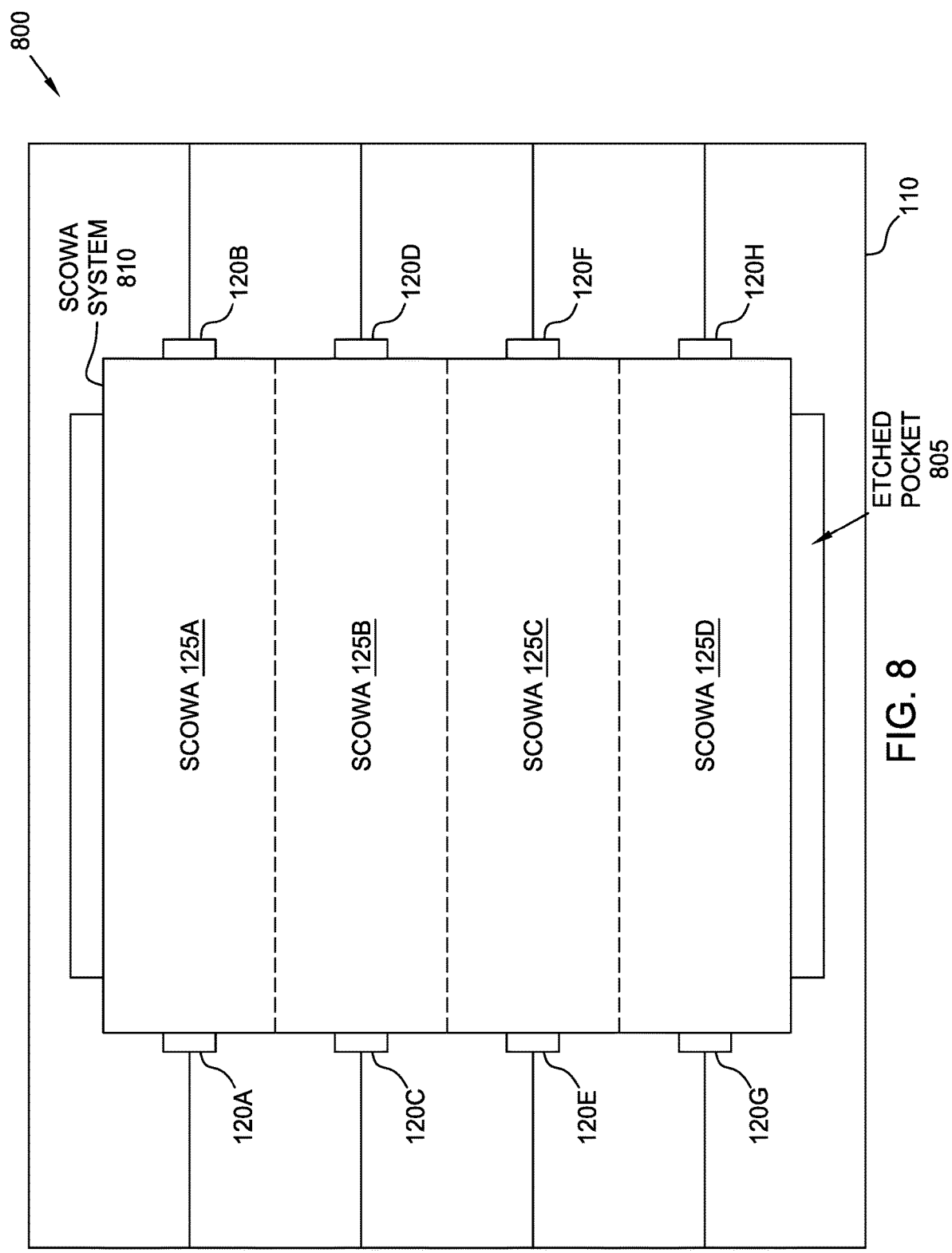
FIG. 8 illustrates a top view of multiple SCOWAs mounted on a silicon photonic chip, according to one embodiment described herein.

FIG. 8 illustrates a top view 800 of multiple SCOWAs 125 mounted on a silicon photonic chip 110, according to one embodiment described herein. In this example, the chip 110 includes an etched pocket 805 large enough to accommodate a SCOWA system 810 which includes multiple SCOWAs (e.g., SCOWAs 125A-125D). For example, the SCOWA system 810 may include a common submount on which the individual SCOWAs 125 are formed. Thus, the SCOWAs 125 can be aligned in the etched pocket 805 as a unit. Put differently, in the same alignment process, each of the SCOWAs 125 can be aligned to respective pairs of the spot size converters 120 in the silicon photonic chip 110.

Figure 9:
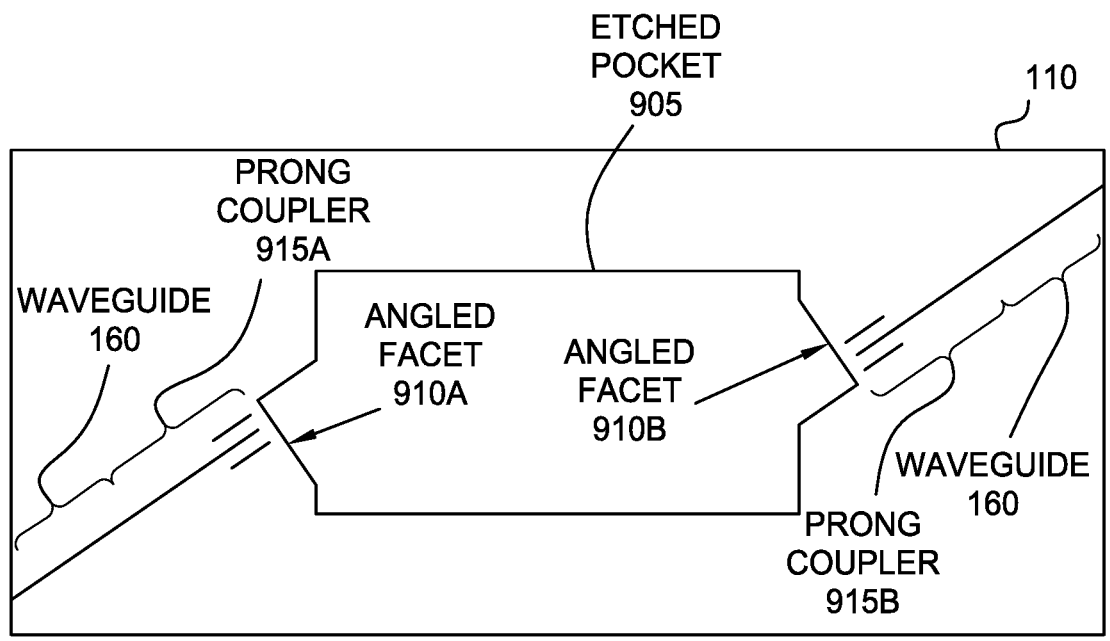
FIG. 9 illustrates forming an etched pocket for a SCOWA in the silicon photonic chip, according to one embodiment described herein.

FIG. 9 illustrates forming an etched pocket 905 for a SCOWA in the silicon photonic chip 110, according to one embodiment described herein. For clarity, the SCOWA has been removed so that the underlying details of the etched pocket 905 can be seen. In this example, the etched pocket 905 includes angled facets 910 for transmitting the optical signal into the SCOWA (as performed by the facet 910A) and receiving the optical signal from the SCOWA (as performed by the facet 910B). The angle of the facets 910 relative to the vertical direction is selected to compensate for the index of refraction when the optical signal leaves the silicon photonic chip 110 and enters into the etched pocket 905 (e.g., air) or into the waveguide layer of the SCOWA. The index of refraction causes the direction of propagating to bend. The same phenomenon occurs when the light leaves the SCOWA, enters in the etched pocket 905, and returns to the photonic chip 110. This is illustrated and discussed in detail in FIG. 11. Generally, the angled facets 910 compensate for index of refraction to improve the coupling efficiency between the SCOWA and the photonic chip and to reduce reflections caused by the index of refraction effects.

In FIG. 9, the photonic chip 110 includes prong couplers 915 which are one example of suitable spot size converters for matching the mode of the SCOWA to the mode of the waveguides 160. That is, the prong couplers 915 increase or decrease the mode size of the optical signal as it propagates therethrough so that the mode size better matches the destination optical element disposed at the end of the prong couplers 915. In this example, the prong coupler 915A increases the mode size of the optical signal received from the waveguide 160 (which can be less than a micron) to a mode size that is closer to the mode size of the waveguide in the SCOWA (e.g., greater than three microns). On the other hand, the prong coupler 915B decreases the mode size of the optical signal received from the SCOWA to a mode size that is closer the mode size of the waveguide 160. In this manner, the prong couplers 915 enable the use of SCOWAs which have large mode sizes with the remaining optical components in the photonic chip 110.

The prong couplers 915 are just one example of suitable spot size converters that can optically couple the photonic chip 110 to the SCOWA. For example, rather than prongs, a spot size converter can include a single monolithic waveguide that increases or decreases in width and height to increase and decrease the mode size. As such, while a prong coupler 915 is specifically described herein, different types of spot size converters can also be used.

Figure 10:
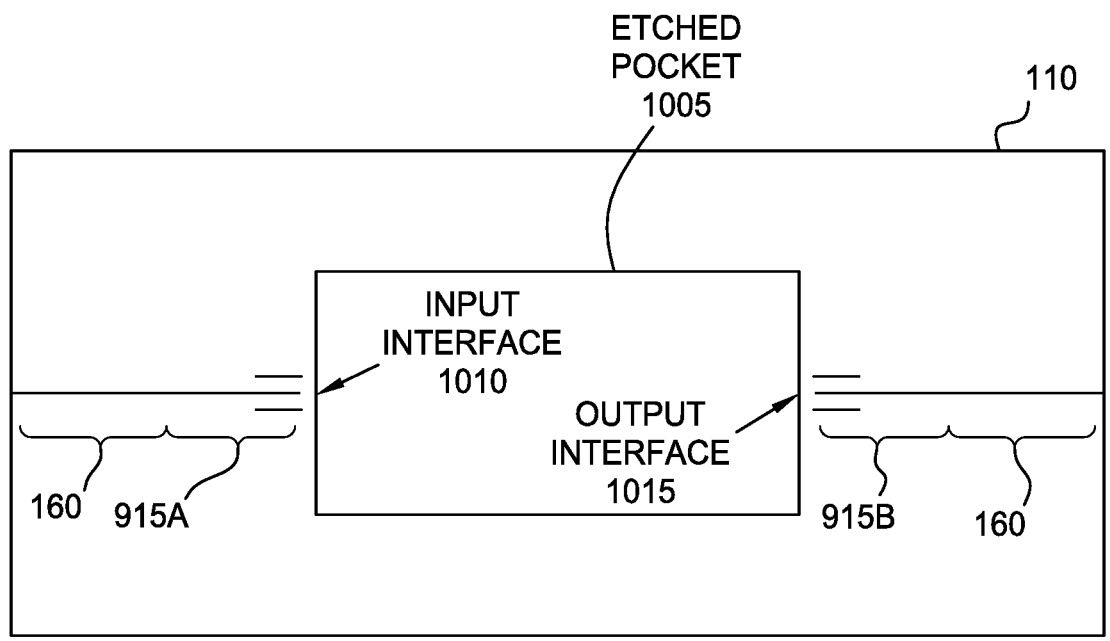
FIG. 10 illustrates forming an etched pocket for a SCOWA in the silicon photonic chip, according to one embodiment described herein.

FIG. 10 illustrates forming an etched pocket 1005 for a SCOWA in the silicon photonic chip 110, according to one embodiment described herein. In this example, the etched pocket 1005 does not include angled facets, but rather has straight surfaces that form an input interface 1010 for transmitting optical signals to the SCOWA and an output interface 1015 from receiving optical signals from the SCOWA. To compensate for the index of refraction between the different materials of the silicon chip 110, the air in the etched pocket 1005, and the materials in the SCOWA, an index matching epoxy (IME) can be placed on the input interface 1010 and the output interface 1015. That is, rather than the optical signals traveling through the air of the etched pocket 1005, after the SCOWA is aligned within the pocket 1005, IME can be disposed in the gap between the SCOWA and the input interface 1010 and between the SCOWA and the output interface 1015.

Figure 11:
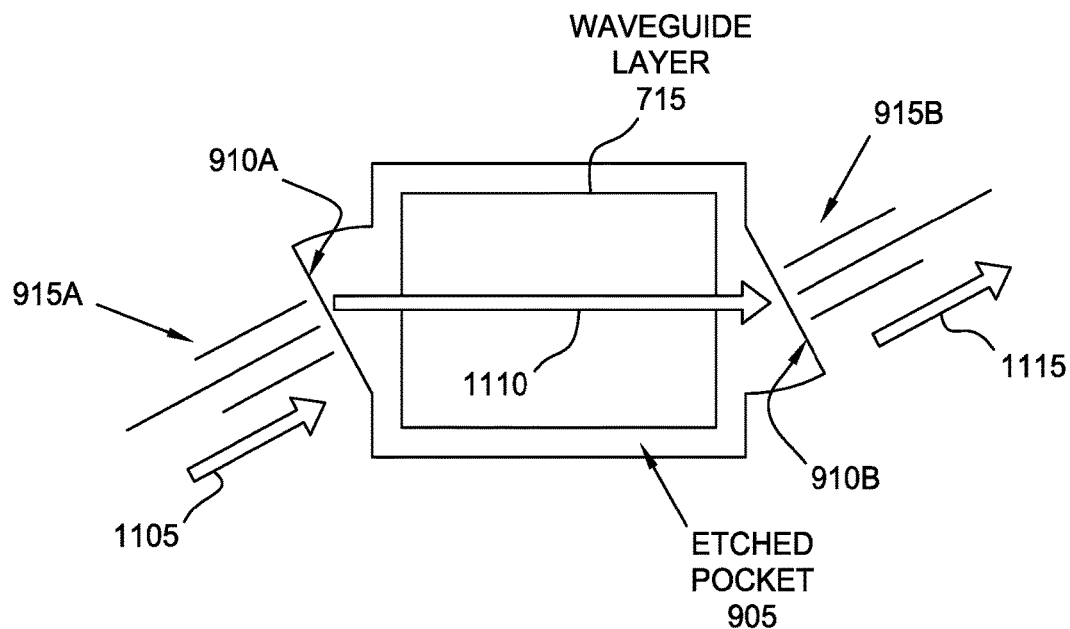
FIG. 11 illustrates an optical signal transferring between prong couplers in the silicon photonic chip and the SCOWA, according to one embodiment described herein.

FIG. 11 illustrates an optical signal transferring between prong couplers 915 in the silicon photonic chip and the SCOWA, according to one embodiment described herein. For clarity, FIG. 11 illustrates only the waveguide layer 715 portion of the SCOWA (e.g., the submount has been omitted) so that the optical interface between the prong couplers 915 and the waveguide layer 715 can be seen.

As shown by arrow 1105, the optical signal propagates through the prong coupler 915A and exits through the angled facet 910A into the etched pocket 905. The index of refraction changes the optical path as shown by arrow 1110 to a horizontal direction (rather than the angled direction defined by the arrow 1105). The direction of the arrow 1110 may permit a more efficient optical coupling with the waveguide layer 715. Moreover, the direction of the optical signal is maintained as shown by the arrow 1110 as the optical signal propagates through the waveguide layer 715 and exits again into the etched pocket 905.

The index of refraction again causes the optical signal to change direction at the angled facet 910B when the optical signal enters back into the photonic chip. This change in direction is illustrated by arrow 1115. By arranging the prong coupler 915B in the same direction as the arrow 1115 (i.e., to match the change of direction introduced by the index of refraction), the optical coupling efficiency is approved.

Figure 12:
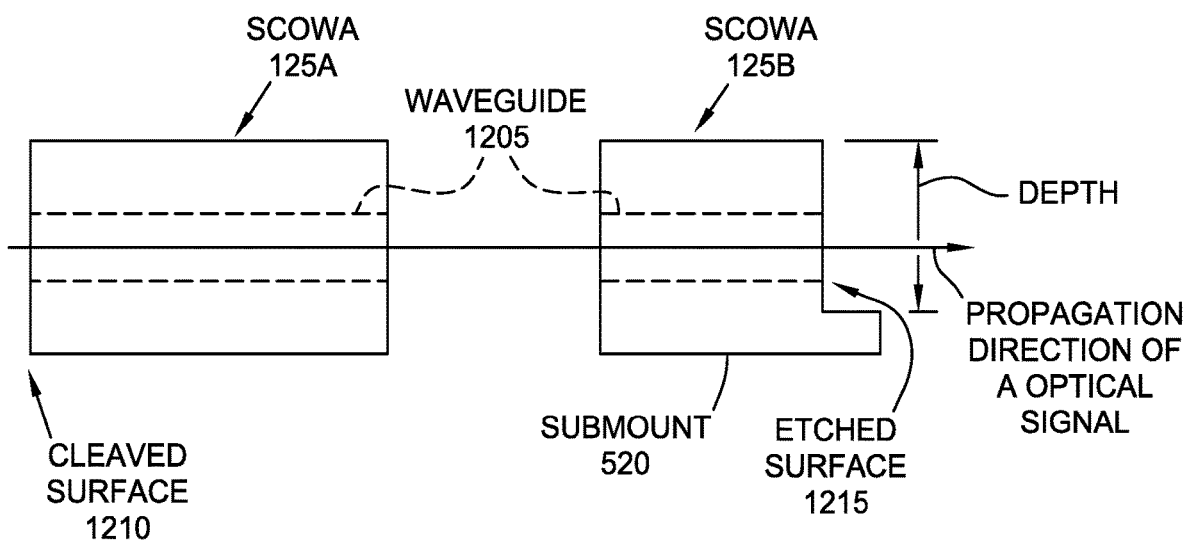
FIG. 12 illustrates forming input/output interfaces of the SCOWA, according to one embodiment described herein.

FIG. 12 illustrates forming input/output interfaces of the SCOWAs, according to one embodiment described herein. As shown, FIG. 12 illustrates side views of two SCOWAs: SCOWA 125A and SCOWA 125B. Both SCOWAs 125 include a waveguide 1205 for propagating and amplifying CW optical signals received from the photonic chip. However, the SCOWA 125A includes a cleaved surface 1210 while the SCOWA 125B includes an etched surface 1215. The lithographic precision used when forming the etched surface 1215 may provide a more accurate mating of the SCOWA 125B to the pocket in the photonic chip than the SCOWA 125A. For example, the cleaving surface 1210 may have a +/−10 micron alignment variation while the etched surface 1215 has <1 micron alignment variation which allows for more precise alignment in the direction the optical signal propagates in the waveguide 1205. Moreover, using a lithographic etch provides flexibility that permits many different types of geometries to suppress parasitic reflections or enables the use of other types of structures.

Further, the etched surface 1215 can be used to help define the submount 520 which sets the depth of the SCOWA 125B. In other words, performing a lithographic etch can be used to accurately set the vertical alignment of the SCOWA 125B in the etched pocket.

Figure 13:
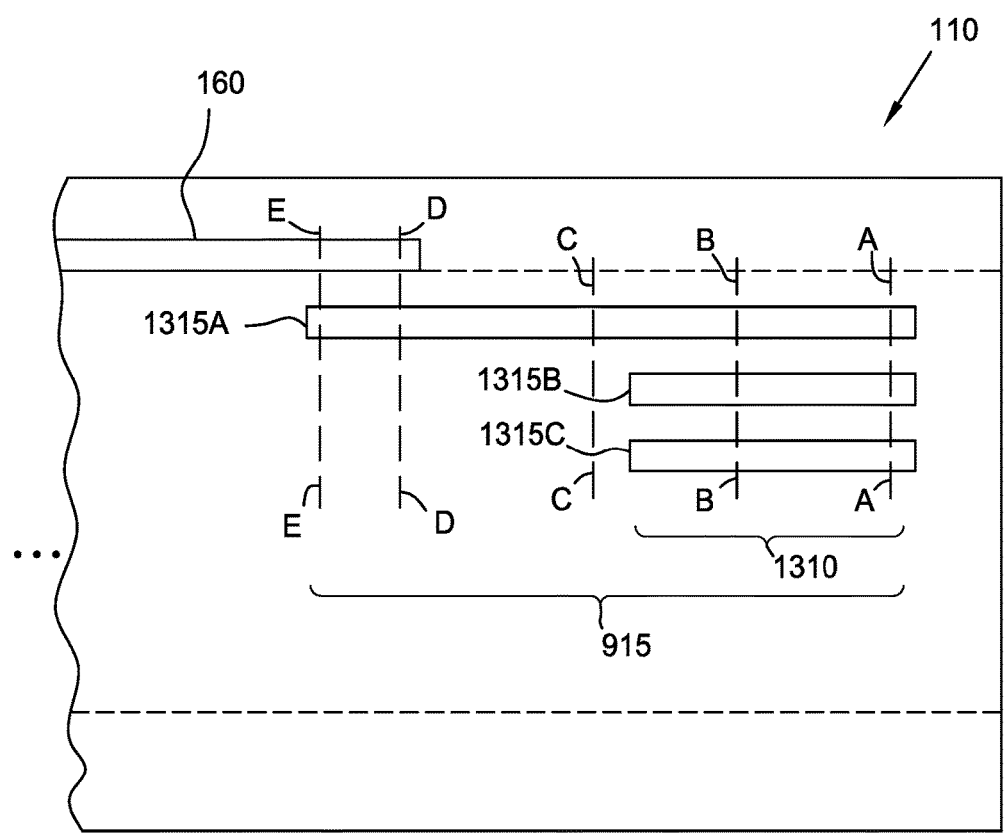
FIG. 13 illustrates a prong coupler, according to one embodiment disclosed herein.

FIG. 13 illustrates a prong coupler 915, according to one embodiment disclosed herein. Specifically, FIG. 13 illustrates a side view of the photonic chip 110 that includes the prong coupler 915 formed using a multi-prong, embedded structure. Here, the silicon waveguide 160 is formed above the prong coupler 915 (e.g., the prong coupler 915 may be embedded in an insulation layer (e.g., an ILD) in the photonic chip 110). However, in another embodiment, the multi-prong structure may be flipped relative to the waveguide 160 such that the prongs of the prong coupler 915 are formed in layers above the silicon waveguide 160 (i.e., the silicon waveguide 160 is between the prongs of the prong coupler 915 and an insulation layer of a silicon-on-insulator (SOI) device).

The prong coupler 915 includes a waveguide adapter 1310 which can be optically coupled to the SCOWA (not shown). The prong coupler 915 is made of separate prongs 1315 that may include the same material (e.g., silicon nitride or silicon oxy-nitride) embedded in an insulative material (e.g., silicon dioxide or silicon oxy-nitride). Generally, the prong coupler 915 may be made of any material with a higher refractive index than the material of the insulative material surrounding the prongs 1315.

Figure 14A:
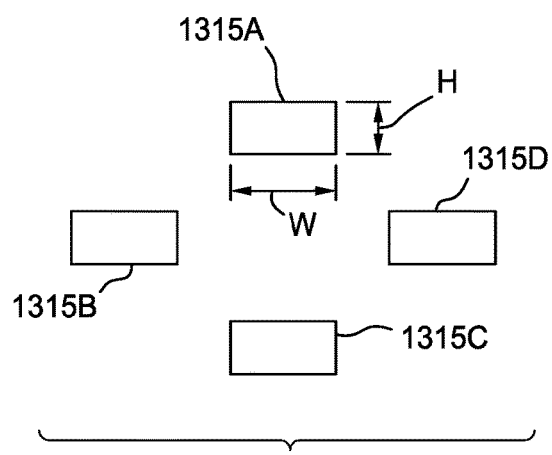
FIGS. 14A-14E illustrate different cross sectional views of the prong coupler in FIG. 13, according to one embodiment disclosed herein.

FIGS. 14A-14E illustrate cross-sectional views of the photonic chip with the prong coupler 915, according to embodiments disclosed herein. Specifically, FIG. 14A illustrates the cross section A-A in FIG. 13 of a portion of the waveguide adapter 1310 that is closest to a neighboring edge coupler (or a coupling interface if the wafer has already been diced). Here, the waveguide adapter 1310 includes four separate prongs 1315A-D that may have the same or similar width (W) and height (H) (or thickness) dimensions. These dimensions, as well as the spacing between the prongs 1315A-D may vary depending on the specific application. In the example shown, the waveguide adapter 1310 may be configured to interface with the single mode waveguide of the SCOWA (either to transmit an optical signal to the SCOWA or receive an optical signal from the SCOWA). As will be appreciated by one of ordinary skill in the art, these dimensions may vary depending on the specific application. The dimensions may be chosen such that the mode of the prong at the coupling interface substantially matches the mode of the external device (e.g., the SCOWA) to which light is to be coupled to or from. Here, the width of the prongs 1315A-D may range from approximately 200-300 nanometers with a height between 100-250 nanometers. More specifically, the width may be around 200 nanometers while the height is approximately 200 nanometers. The distance between prong 1315A and prong 1315C and the distance between prong 1315D and prong 1315B may be around 2-5 microns. As mentioned above, the dimensions, as well as the spacing, of the prongs 1315 may vary according to the mode or design of the SCOWA coupled to the photonic chip.

Figure 14B:
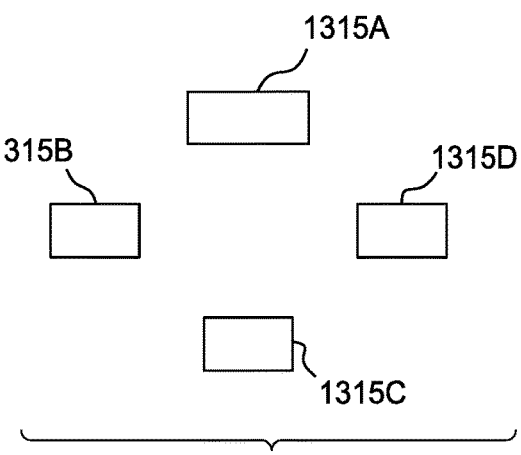

FIG. 14B illustrates the cross section B-B of the waveguide adapter 1310. This figure shows that as the multi-prong adapter is recessed away from the neighboring edge coupler, the width of the prongs 1315B, 1315C, and 1315D reduces while the width of prong 1315A increases. As shown, the tapering of widths of the prongs 1315B-D is done in an adiabatic fashion. The tapering results in a gradual transition of optical energy from an optical mode which is confined by all the prongs 1315A-D at the right side of the waveguide adapter 1310 where the widths and heights of all the prongs 1315A-D are same to a mode which is gradually confined more and more in the upper prong 1315A at positions farther to the left in the adapter 1310. This tapering transfers the optical energy confined by prongs 1315A-D to prong 1315A alone. However, the opposite is also true. That is, tapering the widths also enables a signal introduced in the upper prong 1315A to be transferred to a mode confined by prongs 1315A-D as the optical signal propagates from left to right. The widths of the prongs 1315A-D may change continuously (e.g., a linear or non-linear fashion such as exponentially or at higher order polynomial profiles) or at discrete increments as the waveguide adapter 1310 extends from right to left. As shown in FIG. 13, eventually the prongs 1315B-D terminate (which ends the waveguide adapter 1310) while prong 1315A continues to transmit the optical signal. In one embodiment, the waveguide adapter 1310 may have a length of approximately 100 microns. Furthermore, the waveguide adapter 1310 may taper for all of this length or for only a portion thereof. For example, the widths of the prongs 1315A-D may remain substantially equivalent for the first five to ten microns before the widths of prongs 1315A-D begin to change.

Figure 14C:
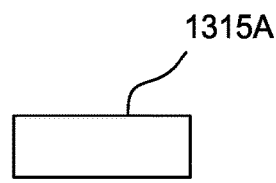

FIG. 14C illustrates the cross section C-C of the prong coupler 915. Here, the waveguide adapter 1310 has terminated which leaves only prong 1315A to carry the optical signal. Although shown as being linear, prong 1315A may bend or twist to carry the optical signal to different areas of the photonic chip or testing structure. Thus, the length of prong 1315A may be much larger than the lengths of prongs 1315B-D to enable prong 1315A to carry an optical signal to different areas.

Figure 14D:
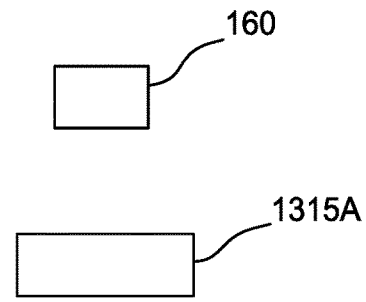

FIG. 14D illustrates the cross section D-D of the prong coupler 915 and silicon waveguide 160. As shown, the width of prong 1315A is larger than the width of the silicon waveguide 160. Moreover, the distance between prong 1315A and the waveguide 160 may range from hundreds of nanometers to only a few nanometers depending on the techniques used to fabricate the wafer. Depending on the technique used to fabricate the wafer, a portion of prong 1315A may directly contact waveguide 160.

Figure 14E:
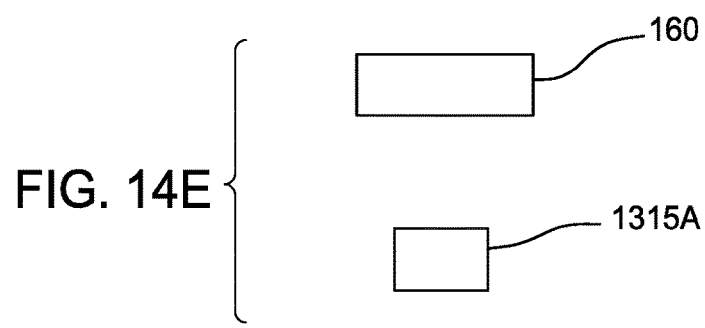

FIG. 14E illustrates the cross section E-E of the prong coupler 915 and silicon waveguide 160. Here, the width of prong 1315A has shrunk while the width of the waveguide 160 has increased. This tapering, which is again shown in an adiabatic fashion, results in the optical signal in prong 1315A to transfer to waveguide 160 and vice versa with minimal loss. Eventually, prong 1315A terminates and waveguide 160 may carry the optical signal to different optical components, e.g., optical components in the photonic chip such as a coherent modulator.

Although the embodiments above discuss tapering the prongs 1315A-D by changing the width, a similar transfer of optical power may occur if the heights are tapered, or some combination of both. However, tapering the height of the prongs 1315A-D may require different lithography and fabrication techniques or materials than tapering the widths as shown in FIGS. 14A-14E. It is also not necessary that the widths of all the prongs are tapered. For example, in certain designs the required transfer of optical energy can be obtained by just tapering the width of prong 1315A alone while the widths of prongs 1315B-D are not tapered.

Figure 15A:
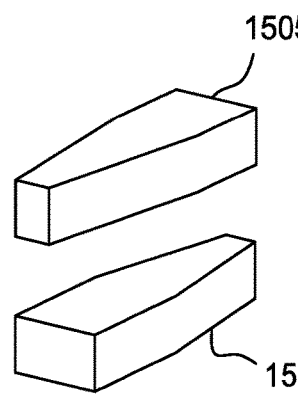
FIGS. 15A and 15B illustrate a tapered waveguide, according to one embodiment disclosed herein.
Figure 15B:
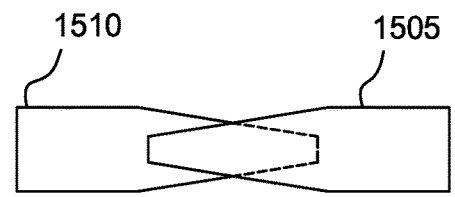

FIGS. 15A-15B illustrate a partially overlapping, inverse-taper waveguide structure for transferring an optical signal between waveguides, according to embodiments disclosed herein. As shown, FIG. 15A illustrates a plan view of a first tapered waveguide 1505 partially overlapping a second tapered waveguide 1510. Specifically, FIG. 15A may be the arrangement of the portion of a photonic chip in FIG. 13 where waveguide 160 overlaps prong 1315A. The tapering of the waveguides is done adiabatically to minimize optical loss. Although FIGS. 15A and 15B illustrate that the widths of the tapers vary linearly, the waveguides can also taper in a non-linear fashion for example exponential or some higher order polynomial profile as long as the adiabatic criterion is satisfied. In one embodiment, the distance between the first and second waveguides 1505 and 1510 is less than a micron. For example, the waveguides 1505, 1510 may be separated by 100 nanometers or less. The separation distance may affect the efficiency with which an optical signal may transfer between the waveguides 1505 and 1510, and thus, a structure may be designed such that the waveguides 1505 and 1510 are as close as fabrication techniques allow.

FIG. 15B illustrates a top view of waveguides 1505 and 1510. By at least partially overlapping the waveguides 1505, 1510, an optical signal may be transferred between waveguide in different layers in the wafer. In one embodiment, the waveguides 1505, 1510 only partially overlap where their respective ends begin to taper. The slope or change of the taper may depend on the material used for forming the waveguides 1505, 1510. In one embodiment, at the widest point, the waveguides 1505, 1510 may have a width that ranges from 200 nanometers to 2 microns. At the narrowest point, the waveguides 1505, 1510 may have a width from 100 nanometers to 200 nanometers. The length of the tapering portion may range from 10 microns to 50 microns—e.g., around 20 microns.

In view of the foregoing, the scope of the present disclosure is determined by the claims that follow.

We claim:

1. A semiconductor photonic chip, comprising:
an input optical interface configured to receive an optical signal from an optical source;
a first spot size converter comprising an input optically coupled to the input optical interface and an output optically coupled to a slab-coupled optical waveguide amplifier (SCOWA), wherein the SCOWA includes one or more slab regions to filter one or more modes, and an active region located near a border of an optical mode of the optical signal, and wherein the first spot size converter is configured to increase a mode size of the optical signal before transferring the optical signal to the SCOWA; and
a second spot size converter comprising an input optically coupled to the SCOWA and an output optically coupled to an optical component in the photonic chip, wherein the second spot size converter is configured to decrease the mode size of an amplified optical signal received from the SCOWA before transferring the amplified optical signal to the optical component.

2. The semiconductor photonic chip of claim 1, further comprising:
a pocket etched between the first and second spot size converters, wherein the SCOWA is mounted within the pocket.

3. The semiconductor photonic chip of claim 2, wherein a waveguide of the SCOWA for amplifying the optical signal received from the first spot size converter is disposed within the pocket, wherein the first and second spot size converters are arranged in the photonic chip to transfer signals between respective sides of the pocket that are perpendicular to a bottom surface of the pocket.

4. The semiconductor photonic chip of claim 3, wherein the respective sides form angled facets that align optical signals passing therethrough with the waveguide of the SCOWA.

5. The semiconductor photonic chip of claim 1, further comprising:
a plurality of SCOWAs comprising the SCOWA; and
a plurality of pairs of spot size converters, wherein a first converter of each pair of the plurality of pairs of spot size converters optically couples a respective SCOWA of the plurality of SCOWAs to the optical source and a second converter of each pair of the plurality of pairs of spot size converters optically couples the respective SCOWA to the optical component.

6. The semiconductor photonic chip of claim 5, wherein the optical component comprises at least two phase modulators optically coupled to each output of the plurality of SCOWAs.

7. The semiconductor photonic chip of claim 5, further comprising:
a pocket etched between each pair of the plurality of pairs of spot size converters, wherein at least a portion of each of the plurality of SCOWAs is disposed within the pocket.

8. The semiconductor photonic chip of claim 1, wherein the optical component is a coherent modulator.

9. The semiconductor photonic chip of claim 1, wherein the first and second spot size converters each comprises a plurality of prongs disposed in a plurality of layers, wherein a width dimension of at least one of the plurality of prongs tapers in a direction of optical propagation in the first and second spot size converters.

10. An optical transmitter comprising:
a laser configured to output a continuous wave (CW) optical signal; and
a photonic chip optically coupled to the laser, the photonic chip comprising:
a first spot size converter comprising an input optically coupled to the laser and an output optically coupled to a SCOWA, wherein the SCOWA includes one or more slab regions to filter one or more modes, and an active region located near a border of an optical mode of the CW optical signal, and wherein the first spot size converter is configured to adjust a mode size of the CW optical signal before transferring the CW optical signal to the SCOWA,
a modulator, and
a second spot size converter comprising an input optically coupled to the SCOWA and an output optically coupled to the modulator, wherein the second spot size converter is configured to adjust the mode size of an amplified optical signal received from the SCOWA before transferring the amplified optical signal to the modulator.

11. The optical transmitter of claim 10, further comprising:
a pocket etched between the first and second spot size converters, wherein the SCOWA is mounted within the pocket.

12. The optical transmitter of claim 11, wherein a waveguide of the SCOWA for amplifying the CW optical signal received from the first spot size converter is disposed within the pocket, wherein the first and second spot size converters are arranged in the photonic chip to transfer signals between respective sides of the pocket that are perpendicular to a bottom surface of the pocket.

13. The optical transmitter of claim 11, wherein the photonic chip further comprises:
a plurality of SCOWAs; and
a plurality of pairs of spot size converters, wherein a first converter of each pair of the plurality of pairs of spot size converters optically couples a respective SCOWA of the plurality of SCOWAs to the laser and a second converter of each pair of the plurality of pairs of spot size converters optically couples the respective SCOWA to the modulator.

14. The optical transmitter of claim 13, wherein the modulator comprises at least two phase modulators optically coupled to each output of the plurality of SCOWAs.

15. The optical transmitter of claim 13, wherein the pocket is arranged between each pair of the plurality of pairs of spot size converters, wherein at least a portion of each of the plurality of SCOWAs is disposed within the pocket.

16. A semiconductor photonic chip, comprising:
a first spot size converter comprising an input configured to receive an optical signal and an output optically coupled to a slab-coupled optical waveguide amplifier (SCOWA); and
a second spot size converter comprising an input optically coupled to the SCOWA and an output optically coupled to an optical component in the photonic chip, wherein the SCOWA is disposed in an etched pocket disposed between the first and second spot size converters,
wherein the first and second spot size converters are configured to adjust a mode size of optical signals to better match respective mode sizes of waveguides corresponding to the SCOWA and the optical component, and
wherein the SCOWA includes one or more slab regions to filter one or more modes, and an active region located near a border of an optical mode of the optical signal.

17. The semiconductor photonic chip of claim 16, wherein a waveguide of the SCOWA for amplifying the optical signal received from the first spot size converter is disposed within the etched pocket, wherein the first and second spot size converters are arranged in the photonic chip to transfer signals between respective sides of the etched pocket that are perpendicular to a bottom surface of the etched pocket.

18. The semiconductor photonic chip of claim 16, further comprising:
a plurality of SCOWAs comprising the SCOWA; and
a plurality of pairs of spot size converters, wherein a first converter of each pair of the plurality of pairs of spot size converters optically couples a respective SCOWA of the plurality of SCOWAs to an optical source generating the optical signal and a second converter of each pair of the plurality of pairs of spot size converters optically couples the respective SCOWA to the optical component.

19. The semiconductor photonic chip of claim 18, wherein the optical component comprises at least two phase modulators optically coupled to each output of the plurality of SCOWAs.

20. The semiconductor photonic chip of claim 16, wherein the optical component is a coherent modulator.

* * * * *